United States Patent [19]

Nishimura

[11] 4,057,738

[45] Nov. 8, 1977

[54] ELECTRONIC CIRCUIT FOR ELIMINATING CHATTER

[75] Inventor: Izuhiko Nishimura, Suwa, Japan

[73] Assignee: Kabushiki Kaisha Suwa Seikosha, Tokyo, Japan

[21] Appl. No.: 629,185

[22] Filed: Nov. 5, 1975

[30] Foreign Application Priority Data

Nov. 5, 1974 Japan .................................. 49-127345
Nov. 9, 1974 Japan .................................. 49-129121

[51] Int. Cl.$^2$ ...................... H03K 17/00; H03K 17/56
[52] U.S. Cl. .................................. 307/247 A; 307/268; 307/269; 307/291; 340/365 E
[58] Field of Search .................. 307/247 A, 268, 269, 307/291; 235/150.51, 183; 328/162–165, 127; 340/365 E

[56] References Cited

U.S. PATENT DOCUMENTS

| 3,504,200 | 3/1970 | Avellar | 340/365 E |
| 3,795,823 | 3/1974 | Morgan et al. | 307/247 A |

FOREIGN PATENT DOCUMENTS

| 1,537,443 | 10/1969 | Germany | 307/247 A |

Primary Examiner—John Zazworsky
Attorney, Agent, or Firm—Blum, Moscovitz, Friedman & Kaplan

[57] ABSTRACT

An electronic circuit for eliminating chatter from a contact signal is provided. The electronic circuit includes a contact for producing a contact signal representative of a change of state. An asynchronous flip-flop is adapted to receive as a first input the contact signal and as a second input a first periodic pulse signal and in response to the coincidence in the changed state of the contact signal and the first periodic pulse signal producing at least one write-in pulse. A synchronous flip-flop is provided for receiving as a first input the write-in pulses produced by the asynchronous flip-flop and as a second input a second periodic pulse signal, the second periodic pulse signal being synchronized with respect to the first periodic pulse signal so that the leading edge of the first periodic signal defining the coincidence condition precedes a leading edge of the second pulse. The synchronous flip-flop in response to the write-in pulses and the leading edge of the second periodic pulse signal produces an output signal representative of the changed state of the contact signal.

6 Claims, 17 Drawing Figures

FIG.17

ELECTRONIC CIRCUIT FOR ELIMINATING CHATTER

BACKGROUND OF THE INVENTION

This invention is directed to an electronic circuit for eliminating the chatter signal in a contact signal, and in particular to a chatter eliminating electronic circuit that is comprised entirely of semi-conductor integrated circuitry.

Heretofore, elimination of the chatter signal in a contact signal produced by a switch, relay and the like has taken on various forms. For example, RC filter circuits are utilized to eliminate the chatter signal and provide an inherent contact signal. Nevertheless, the impedance elements comprising the RC filter circuit, and in particular the capacitor, prevent the type of miniaturization obtainable by utilizing integration circuit techniques. Accordingly, the use of RC filter circuits, and other type impedance filter circuits for eliminating the chatter signal in a contact signal are less than completely satisfactory.

SUMMARY OF THE INVENTION

Generally speaking, in accordance with the invention, an electronic circuit for eliminating the chatter signal in a contact signal is provided. The electronic circuit includes a contact element for producing a contact signal representative of a change of state. An asynchronous logic circuit receives as a first input a contact signal and as a second input a first periodic pulse signal, and in response to a coincidence in the changed state of said contact signal and said first periodic pulse signal produces at least one write-in pulse. A second periodic pulse signal is synchronized with respect to the first periodic pulse signal so that a leading edge of the first periodic signal defining said coincidence condition precedes a corresponding leading edge of said second periodic pulse signal. A synchronous logic circuit receives as a first input the write-in pulses produced by the asynchronous logic circuit and as a second input the second periodic pulse signal, and in response to the write-in pulses and the leading edge of the second periodic pulse signal, produces an output signal representative of the changed state of the contact signal.

Accordingly, it is an object of this invention to provide an improved electronic circuit for eliminating the chatter signal from a contact signal.

A further object of the instant invention is to provide an electronic circuit for producing a signal coincident with the change of state of a contact signal wherein the chatter signal in the contact signal is completely eliminated.

Still a further object of the instant invention is to provide an improved electronic circuit for eliminating chatter from a contact signal, the electronic circuit being formed from semi-conductor type elements of the type readily integrated into a circuit chip.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
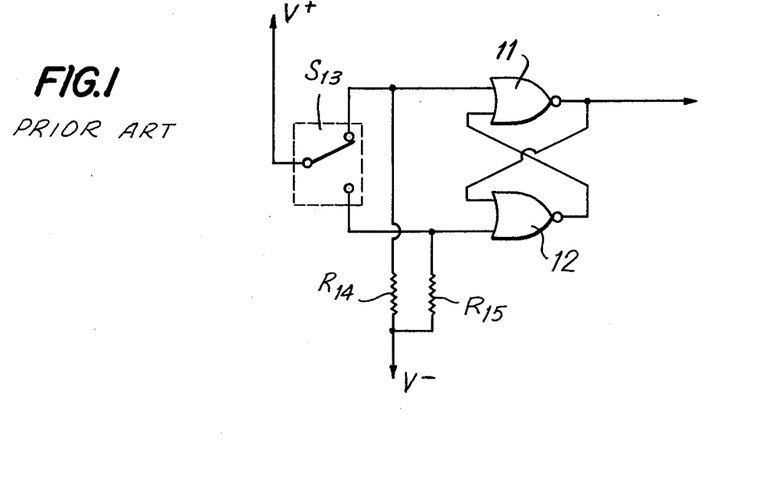
FIGS. 1 and 2 are circuit diagrams of circuits constructed in accordance with the prior art for eliminating the chatter signal in a contact signal.
Figure 2:
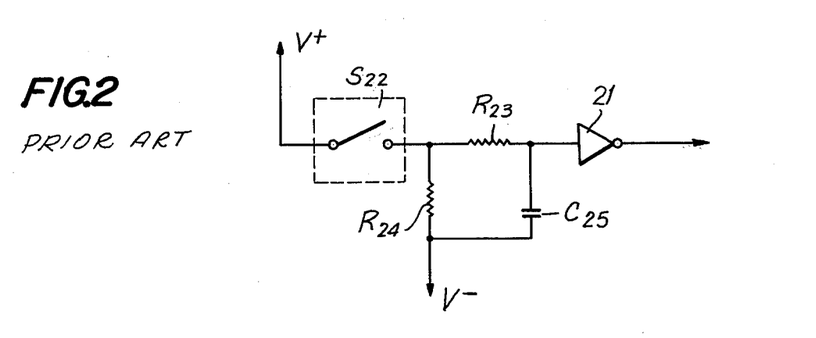

Reference is now made to FIGS. 1 and 2 wherein chatter signal eliminating circuits of the prior art are depicted. Specifically, in the circuit depicted in FIG. 1, a transfer contact $S_{13}$ is coupled to the respective set and reset terminals of a set-reset flip-flop (R/S - FF) comprised of NOR gates 11 and 12. Clamping resistors $R_{14}$ and $R_{15}$ are respectively coupled to the set and reset terminals and in combination with the inherent operating function of the set-reset flip-flop effect elimination of the chatter signal.

In FIG. 2, a chatter eliminating circuit for a single contact element such as single contact $S_{22}$ is depicted. An RC filter circuit comprised of resistor $R_{23}$ and capacitor $C_{25}$ filter out the high frequency chatter signal from the contact signal produced by single contact $S_{22}$, and resistor $R_{24}$ effects clamping down of the input signal.

Also, a buffer amplifier 21, such as a MOS transistor element having a high input impedance is utilized to produce the output signal.

In the circuit depicted in FIG. 1, the chatter signal cannot be entirely eliminated unless a high quality double-throw switch having good isolation characteristics is utilized. In the circuit depicted in FIG. 2, in order to substantially eliminate all of the chatter signal, a large capacitor in the RC filter circuit is required. The size of the capacitor renders same less than completely satisfactory for use in instruments requiring miniaturization. Moreover, the capacitor cannot be integrated into a circuit chip and hence the use of same requires the coupling of an additional element to a circuit chip and the attendant lack of reliability and increase in the cost in utilizing such a chatter signal eliminating circuit.

The instant invention eliminates certain of the defects noted above with respect to the prior art by utilizing an electronic circuit to eliminate chatter comprised of component elements readily formed into integrated circuits by semi-conductor integration techniques. Specifically, as is discussed in greater detail below, by utilizing an asynchronous logic circuit and a synchronous logic circuit and respectively applying a first periodic pulse signal and a second periodic pulse signal synchronized with respect to each other, an output signal representative of a change in the state of a contact signal with the chatter signal entirely eliminated is provided in accordance with the instant invention.

Figure 3:
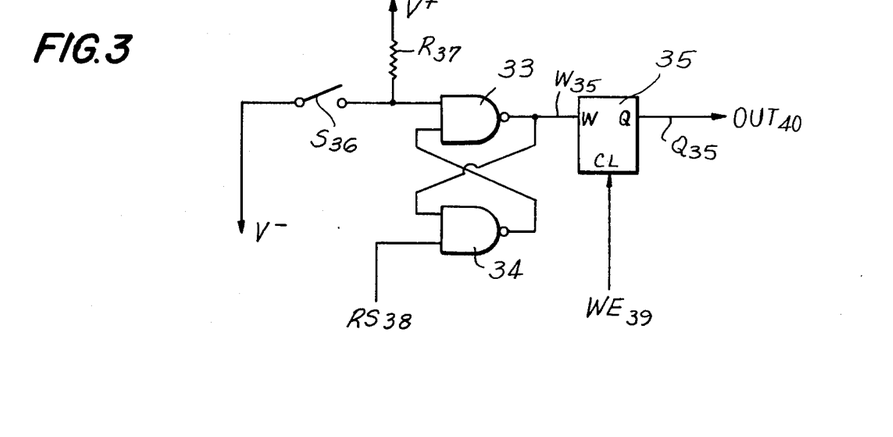
FIG. 3 is a circuit diagram of an electronic circuit for eliminating chatter constructed in accordance with a preferred embodiment of the instant invention.

Reference is now made to FIG. 3, wherein a detailed circuit diagram of an electronic circuit for eliminating chatter in accordance with the instant invention is depicted. A set-reset flip-flop circuit comprised of NAND gates 33 and 34 defines an asynchronous memory. A switch contact $S_{36}$ is coupled to NAND gate 33 and defines the set input of the set-reset flip-flop. Although contact $S_{36}$ is illustrated as a switch, it is noted that the instant invention is not limited to a switch contact element but is directed to eliminating the chatter signal of other contact signals produced by relays and the like. A resistor $R_{37}$ is coupled between a high potential $V+$ and the set input, and references the set input to a high potential $V+$ when the contact $S_{36}$ is open. When contact $S_{36}$ is closed, the set input is referenced to a lower potential $V-$. Accordingly, since the set-reset flip-flop is comprised of NAND gates, when contact $S_{36}$ is open, the set-reset flip-flop is in a non-set state and produces a "0" binary state output, and when contact $S_{36}$ is closed, the set-reset flip-flop is placed in a settable condition whereby a "1" binary output can be produced depending upon the input at the reset terminal. A periodic reset pulse signal $RS_{38}$ is applied to the input of NAND gate 34, which input defines the reset terminal of the set-reset flip-flop. Accordingly, when the low potential $V-$ is applied to the set input terminal of the set-reset flip-flop, the binary state of the periodic reset pulse signal $RS_{38}$ determines the binary state of the set-reset flip-flop output signal produced by NAND gate 33.

The output of the NAND gate 33 is applied as a write-in signal $W_{35}$ to a synchronous memory circuit comprised of D-flip-flop 35, which circuit is controlled by periodic clock pulse signal $WE_{39}$ and produces an output signal $Q_{35}$ representative of the binary state of the write-in signal $W_{35}$ synchronous with the leading edges of periodic clock pulse $WE_{39}$. As explained in greater detail below, the output signal $OUT_{40}$ represents the contact signal produced by the contact $S_{36}$ with the chatter signal eliminated.

D-flip-flop 35 is a half-bit flip-flop, it being noted that a half-bit is sufficient for the use of a D-flip-flop as a memory element. It is further noted that the synchronous memory can also be comprised of a master-slave type D-flip-flop (delay flip-flop).

Figure 4:
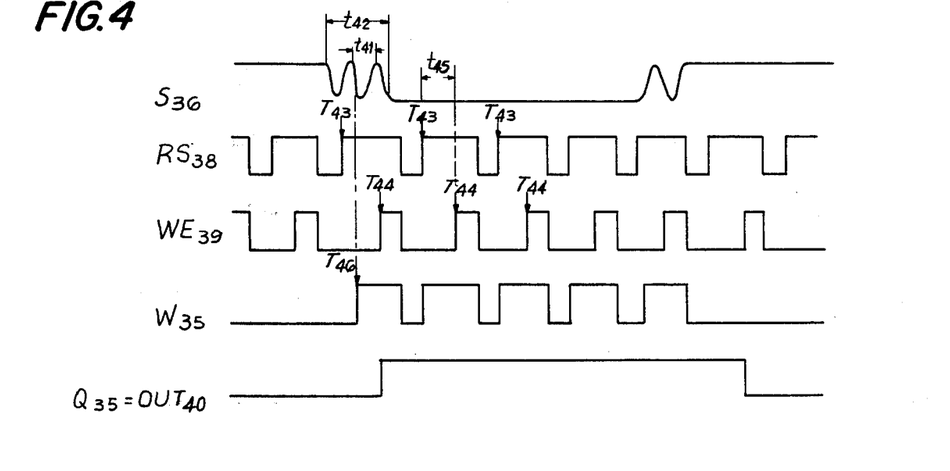
FIG. 4 is a wave diagram depicting the operation of the electronic circuit depicted in FIG. 3.

Referring specifically to FIG. 4, the contact signal $S_{36}$ includes a chatter signal having a duration $t_{42}$. With conventional mechanical contact, as opposed to special switches such as a reed switch, the duration time $t_{42}$ of the chatter signal is on the order of several tens to several hundreds milliseconds, while the period $t_{41}$ of the chatter signal is several hundred micro-seconds to several milliseconds. Thus, the frequency of the chatter signal is usually on the order of several hundred Hz to several thousand Hz, depending on the type of contact used.

In operation, the leading edge, indicated at $T_{43}$ of the periodic reset pulse signal $RS_{38}$ applies a "1" binary state input to the NAND gate 34 and places the set-reset flip-flop in a settable state. Thereafter, contact signal $S_{36}$ including the chatter signal occuring during the duration $t_{42}$ effects a setting of the set-reset flip-flop and hence an application of a "1" write-in pulse to the D-flip-flop 35. Accordingly, the set-reset flip-flop holds the set to "1" signal obtained at the leading edge of the reset pulse signal $RS_{38}$ at least until the leading edge of the periodic clock pulse signal $WE_{39}$ is applied to the D-flip-flop 35 at $T_{44}$ to thereby effect a writing-in of the "1" set signal to the D-flip-flop. The periodic reset pulse signal $RS_{38}$ is synchronized with respect to the clock pulse signal and effects resetting of the set-reset flip-flop to "0" after the occurrence of the leading edge of the periodic clock pulse at $T_{44}$. Nevertheless, if the contact signal $S_{36}$ remains in the "0" changed state, the set-reset flip-flop and the write-in pulse $W_{35}$ is once again set to "1" at $T_{43}$ to thereby maintain the output pulse $OUT_{40}$ at a "1" binary state, thereby effectively holding the set state of the set-reset flip-flop. Accordingly, the output signal $OUT_{40}$ will produce a contact signal during the interval that the contact signal $S_{36}$ applies a set signal to the set input terminal of the set-reset flip-flop. Finally, upon the opening of contact $S_{36}$ and hence the termination of a set signal being applied to the input terminal of the set-reset flip-flop, same is reset to "0," thereby changing the state of write-in pulse $W_{35}$ to "0," and causing a "0" to be written into the D-flip-flop upon the next occurrence of a leading edge of the periodic clock pulse signal at $T_{44}$ being applied to flip-flop 35 and returning the binary state of the output signal $OUT_{40}$ to "0."

Accordingly, a contact signal $OUT_{40}$ with the chatter signal eliminated is obtained. It is noted that the periodic reset pulse signal $RS_{38}$ and the periodic clock pulse signal $WE_{39}$ are synchronized with respect to each other so that the leading edge of reset pulse signal $RS_{38}$ occurs at a time $T_{43}$ and the leading edge of the clock pulse signal $WE_{39}$ occurs at a time $T_{44}$. Accordingly, the predetermined interval of time between the time $T_{43}$ of the occurrence of the leading edge of the reset pulse signal $RS_{38}$ and the time $T_{44}$ of the occurrence of the leading edge of the clock pulse signal $WE_{39}$, illustrated as $t_{45}$ in the drawings is determined by the period of the chatter signal or a peak-to-peak frequency component thereof. In an actual embodiment, if the duration $t_{45}$ is at least 4 milliseconds, such period of time will be sufficient to entirely eliminate the chatter signal, notwithstanding the extent of the duration $t_{42}$ of the chatter signal, which duration does not affect the successful operation of the invention.

Figure 11:
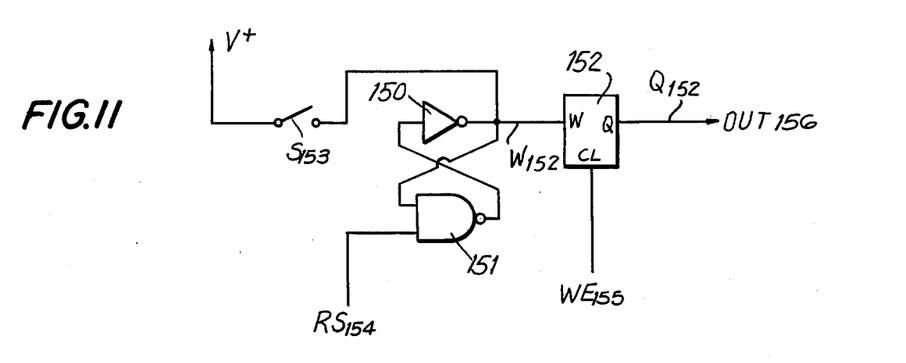
FIG. 11 is a circuit diagram of an electronic circuit for eliminating chatter constructed in accordance with an alternate embodiment of the instant invention.
Figure 12:
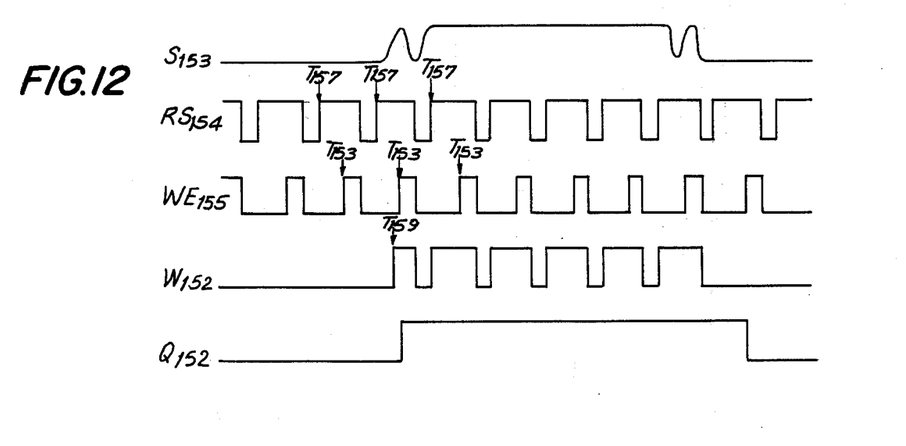
FIG. 12 is a wave diagram depicting the operation of the electronic circuit illustrated in FIG. 11.

Reference is now made to FIGS. 11 and 12, wherein an electronic circuit for eliminating chatter constructed in accordance with a further embodiment of the instant invention is depicted. The contact signal from contact $S_{153}$ is coupled to the high potential side V+ of a potential source and is further connected to the output of an inverter 150, which inverter 150 in combination with NAND gate 151 defines an asynchronous set-reset flip-flop memory circuit. When the contact $S_{153}$ is open, a low potential is applied at the output of inverter 150, and when contact $S_{153}$ is closed, a high potential is applied at the output of inverter 150. The output of inverter 150 is applied as the write-in pulse $W_{152}$ to the asynchronous D-flip-flop memory circuit 152. Accordingly, maintaining the output of inverter 150 at a low potential effectively maintains the set-reset flip-flop at a non-set condition and hence write-in pulse $W_{152}$ at a low potential when contact $S_{153}$ is open. The closing of contact $S_{153}$ effects a setting of the set-reset flip-flop and renders the state of the write-in pulse $W_{152}$ dependent on the setting and resetting of the set-reset flip-flop by the application of periodic reset pulse signal $RS_{154}$ to the reset terminal defined by NAND gate 151. The write-in pulse input is written into the D-flip-flop 152 by periodic clock pulse signal $WE_{155}$ in the same manner noted above.

Accordingly, the chatter signal is removed from the contact signal in the same manner shown and described in the embodiment depicted in FIGS. 3 and 4. Specifically, the state of the contact signal having been changed during the period from time $T_{157}$ at which the set-reset flip-flop is set, to the time $T_{159}$, at which the D-flip-flop 152 is placed in the write-in state by clock pulse signal $WE_{155}$, and whereafter, D-flip-flop 152 is held in the write-in state as the set-reset flip-flop is reset and once again set during the entire interval of time that the state of the contact signal is changed. Accordingly, the chatter signal is eliminated in the identical manner that same was eliminated in the embodiment shown and described above.

It is noted that the embodiment depicted in FIGS. 11 and 12 allows the bias resistor $R_{37}$ illustrated in FIG. 3 to be omitted since the output of the inverter 150 is connected to the low potential side V− when there is no set input provided. The elimination of a further resistor simplifies the circuit and hence facilitates the integrating of same.

Figure 13:
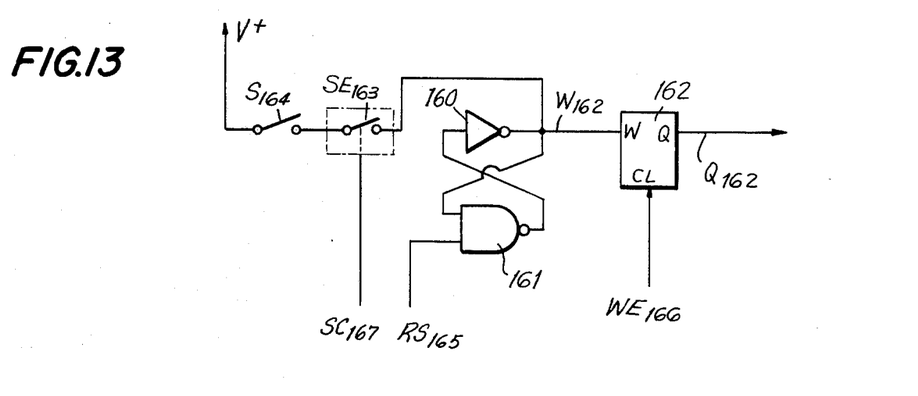
FIG. 13 is a circuit diagram of an electronic circuit for eliminating chatter constructed in accordance with another embodiment of the instant invention.
Figure 14:
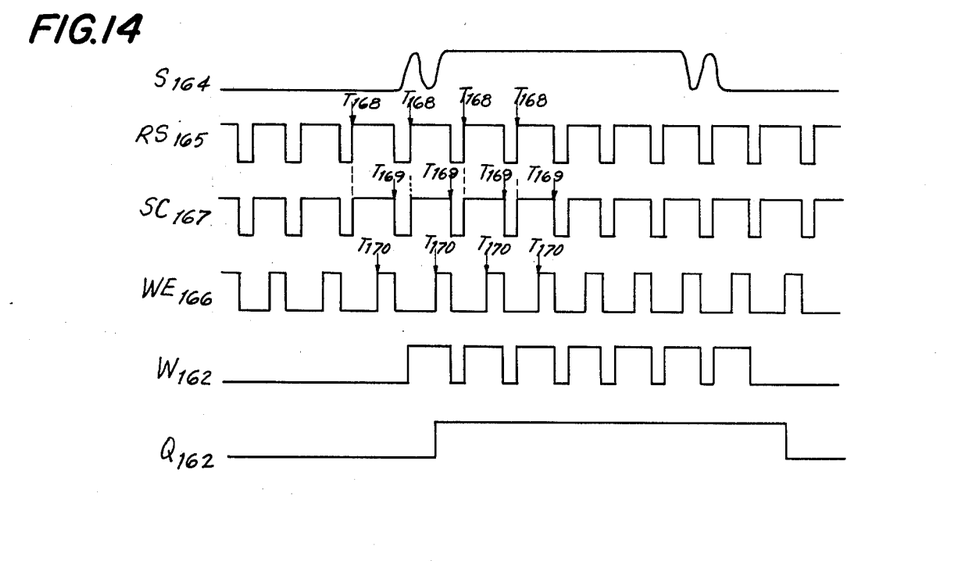
FIG. 14 is a wave diagram depicting the operation of the electronic timepiece depicted in FIG. 13.

Reference is now made to FIGS. 13 and 14 wherein a further embodiment of the instant invention is depicted. The asynchronous set-reset flip-flop memory is comprised of NAND gate 161 and inverter 160 and is coupled to synchronous D-flip-flop memory circuit 162 in the same manner illustrated in FIG. 11. Accordingly, periodic reset clock pulse $RS_{165}$, clock pulse signal $WE_{166}$ and contact $S_{164}$ operates in the same manner discussed above with respect to FIGS. 11 and 12. However, an input timing circuit $SE_{163}$ is disposed intermediate contact $S_{164}$ and the output of inverter 160 to prevent the coincident application of a set input signal and reset input signal to the respective set and reset terminals of the asynchronous flip-flop and the possible mis-operation caused thereby. Input timing circuit $SE_{163}$ is comprised of an electronic switching element such as MOS transistor or bipolar transistor, a P-channel MOS transistor being particularly suited for use in the embodiment depicted in FIG. 13 since contact $S_{164}$ is coupled to positive potential V+

When the set signal and the reset signal are simultaneously applied to the set-reset flip-flop, the circuit does not admit of proper operation. Specifically, when the reset pulse signal $RS_{165}$ is referenced to a low potential, the output of NAND gate 161 is referenced to a high potential. Accordingly, a low potential is produced at the output of inverter 160. If the contact $S_{164}$ is closed at the same time that a reset signal is applied, the inverter output 160 will be referenced to a high potential but the set-reset flip-flop will be producing a low potential thereby causing current flow and an indeterminate potential to be applied to the write-in input of D-flip-flop 162. In order to avoid such current flow, input timing circuit $SE_{163}$ is controlled by a third periodic pulse signal, namely, input timing control signal $SC_{167}$, which signal prevents the abovenoted indeterminate condition from occurring by preventing the set-input from being applied to the set-reset flip-flop when same is reset. As is specifically detailed in FIG. 14, the set input is inhibited by the input timing circuit $SE_{163}$ during the period between time $T_{169}$ and time $T_{168}$, during which period a "0" state reset signal $RS_{165}$ is applied to the set-reset flip-flop. The remaining operation of the circuit is identical to the circuits shown and described in FIGS. 3 and 4 and FIGS. 11 and 12.

The electronic circuits for eliminating the chatter signal hereinabove described are particularly suitable for use in an electronic wristwatch or an electronic table calculator wherein miniaturization is a prime requisite. Moreover, in order to reduce the power consumption, the electronic circuits discussed above, and in particular, the input timing circuit illustrated in FIG. 13 can utilize complementary MOS (CMOS) circuitry. For example, an input timing circuit and the inverter portion of a set-reset flip-flop of the type illustrated in FIG. 13 and formed of CMOS transistors is illustrated in detail in FIG. 15. The inverter is comprised of a P-channel MOS transistor $T_{172}$ and a N-channel MOS transistor $T_{173}$, which transistors define a C-MOS inverter with an input terminal $G_{171}$ defined by the commonly coupled gate electrodes and an output terminal $D_{174}$ defined by the commonly coupled drain output terminals. Contact $SE_{176}$ is coupled to a positive potential, and hence a P-channel transistor is effectively utilized as an input timing circuit. The input timing circuit is opened and closed by the application of a periodic control input pulse signal $SC_{177}$ applied to the gate terminal of P-channel transistor $SE_{175}$.

Figure 15:
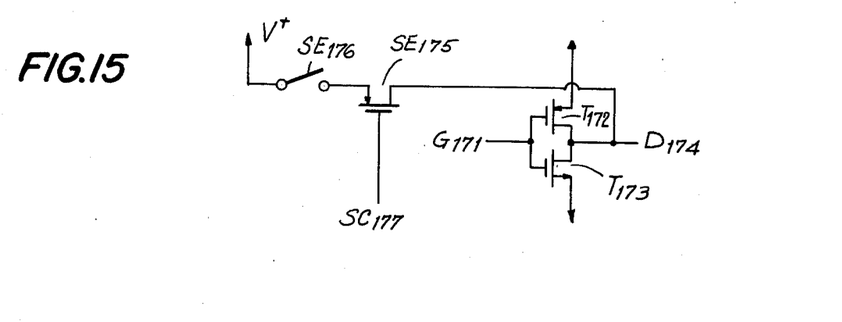
FIG. 15 is a detailed circuit diagram of an input timing circuit utilized in the electronic circuit embodiments depicted in FIGS. 7, 9, 13 and 17.

Accordingly, when utilized in the circuit depicted in FIG. 13, the drain output terminal $D_{174}$ is coupled to the input of the NAND gate, which NAND gate would also be formed of CMOS transistors, and the common gate $G_{171}$ is coupled to the output of the NAND gate. When the potential of the output drain terminal $D_{174}$ is referenced to the higher potential V+ by the closing of contact $SE_{176}$, the transition potential of the inverter circuit is determined by the ratio of the respective conductive impedances of the transistor $T_{173}$ and $SE_{175}$. The potential must therefore be raised close enough to the high potential V+ to actuate the NAND gate. In order to approach such potential, it is necessary to reduce the ON impedance of P-channel transistor $SE_{175}$, and hence it is necessary to select same with an ON impedance considerably smaller than the ON impedance of the N-channel MOS transistor $T_{173}$ (1/5 and less is necessary). Such reduction in the ON impedance of the P- channel transistor is also necessary in order to shorten the period of current flow during which the transition of the two transistors occurs.

Figure 16:
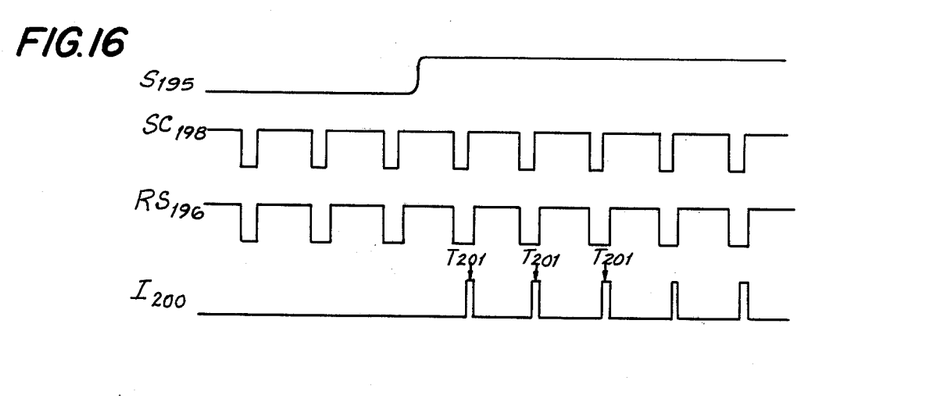
FIG. 16 is a wave diagram illustrating a method of improving the noise resistance in the electronic circuit constructed in accordance with the instant invention.

Although the use of an input timing circuit, such as input timing circuit $SE_{163}$ can effect the complete elimination of the overlap between the reset signal and the set signal, same can cause the generation of excessive noise. The problem of excessive noise causes a lowering of the noise resistance so that the inverter 160 is inverted even if the contact $S_{164}$ is opened. In order to improve the noise resistance, the method depicted in FIG. 16 is possible, whereby the noise is absorbed for the period that the reset signal $RS_{196}$ and the input timing signal $SC_{198}$ are in part overlapping with respect to each other. Signal $I_{200}$ illustrates the current flowing in the drain output terminal of the inverter at such time. When the contact is closed, the current flowing at the time $T_{201}$ corresponds to the overlap portion of the reset signal $RS_{196}$ and the input timing signal $SC_{198}$. Nevertheless, since the period is short, the resulting current consumption is sufficiently small as to be deemed negligible and hence ignored.

Figure 17:
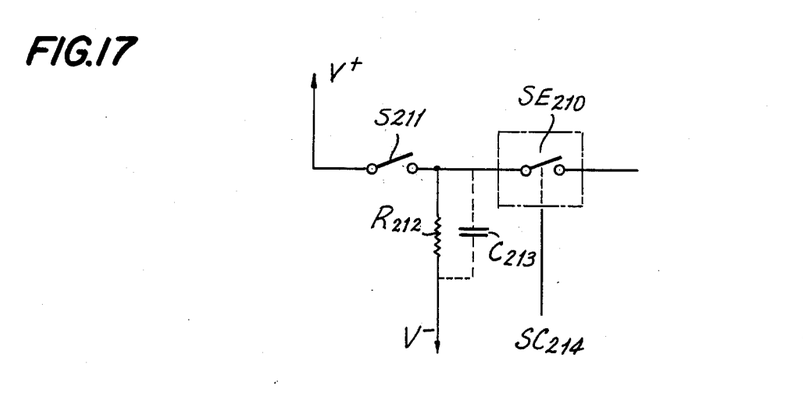
FIG. 17 is a circuit diagram illustrating a circuit for improving the noise resistance caused by the circuit depicted in FIG. 15.

Still another method of avoiding noise resistance is illustrated in FIG. 17 wherein resistor $R_{212}$ is disposed intermediate a contact $S_{211}$ and an input timing circuit $SE_{210}$ and the parasitic capacitance $C_{213}$ generated between the input timing circuit and the contact is discharged through resistor $R_{121}$.

Figure 5:
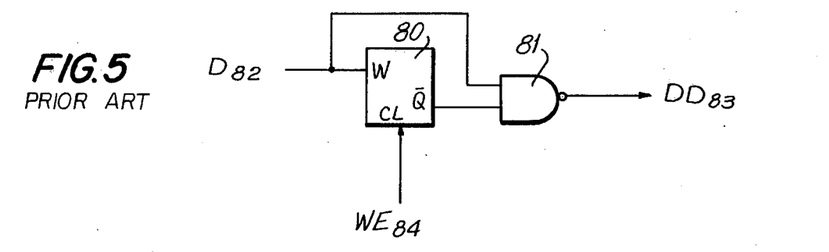
FIG. 5 is a circuit diagram of a differentiator circuit constructed in accordance with the prior art.
Figure 6:
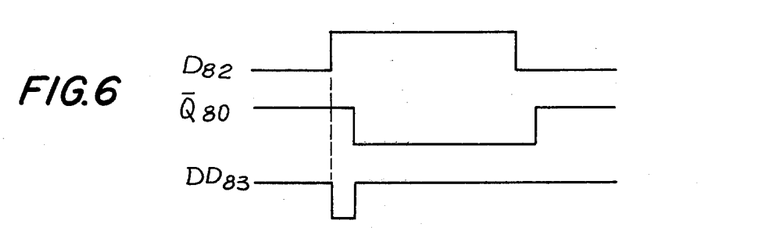
FIG. 6 is a wave diagram depicting the operation of the differentiator circuit depicted in FIG. 5.

When a contact signal is utilized, it is often necessary to use the timing at a particular ON or OFF contact position as a pulse signal. For example, in an electronic wristwatch, a circuit for displaying a particular time requires that a pulse signal applied at the moment that a button is pushed. In order to utilize a signal produced by the push-button, a pulse differentiator circuit of the type depicted in FIGS. 5 and 6 is utilized. Such differentiator circuits are comprised of a half-bit synchronous D-flip-flop 80 having a clock pulse $WE_{84}$ applied thereto and a NAND gate 81, which NAND gate 81 receives as a first input $\overline{Q}_{80}$ from D-flip-flop 80 and as a second input the write-in input $D_{82}$ applied to D-flip-flop 80. As illustrated in FIG. 6, the pulse width of the output pulse signal $DD_{83}$ produced by NAND gate 81 is a differentiated pulse signal having a pulse width determined by the pulse width of the clock pulse $WE_{84}$. Alternatively, instead of utilizing the rising edge of the input signal $D_{82}$, the falling edge of the input signal $D_{82}$ can be utilized to produce the differentiated pulse. It is noted that in differentiator circuits of the type depicted in FIG. 5, the input signal $D_{82}$ is synchronized with the clock signal $WE_{84}$. Nevertheless, as is the case with most contact signals and the means for producing same, the contact signal is not synchronous with the inner clock signal of the circuit and it is therefore necessary to make same synchronous with the inner clock signal of the circuit by utilizing a synchronizing circuit. One further method of eliminating the timing of the input signal utilized in the prior art is to utilize a differentiation circuit comprised of a resistor and capacitor. Nevertheless, whatever method is utilized, a circuit for detecting the timing independently of the circuit utilized to eliminate the chatter must be provided in order to detect the timing of the contact signal, such methods rendering more difficult the integration of the chatter eliminating electronic circuit.

Figure 7:
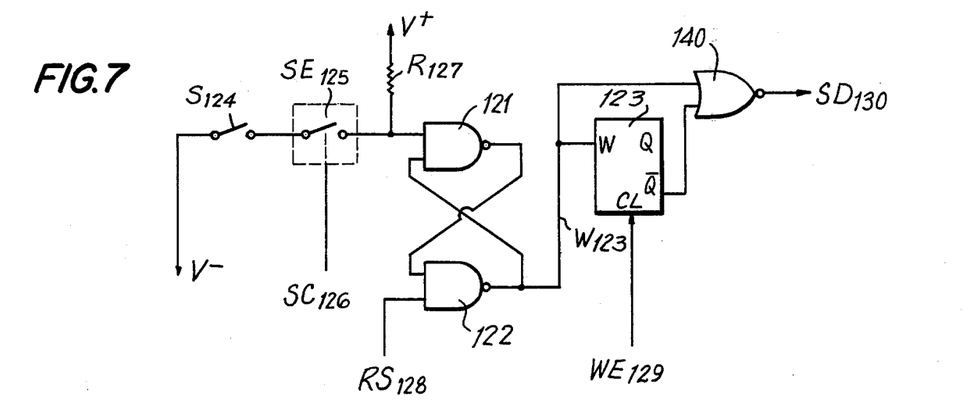
FIG. 7 is a circuit diagram of an electronic circuit for eliminating chatter and producing a differentiator pulse constructed in accordance with a preferred embodiment of the instant invention.

Reference is now made to FIG. 7, wherein an electronic circuit for eliminating chatter and additionally producing a differentiated pulse is depicted. A contact $S_{124}$ is coupled to a lower potential $V_-$ and is further coupled to input timing circuit $SE_{125}$, which circuit is controlled by timing control signal $SC_{126}$. The input timing circuit $SE_{125}$ is coupled to the input of NAND gate 121, which NAND gate and NAND gate 122 define an asynchronous set-reset flip-flop memory circuit. The set terminal of the set-reset flip-flop is referenced to higher potential $V^+$ through bias resistor $R_{127}$. Reset pulse signal $RS_{128}$ is applied to the reset terminal of the set-reset flip-flop defined by the input of NAND gate 122. The output of the set-reset flip-flop defined by the output of NAND gate 122 is applied to the write-in terminal W of synchronous D-flip-flop 123 as write-in pulse signal $W_{123}$. Additionally, a NOR gate 140 is coupled to receive the output $\overline{Q}_{123}$ from D-flip-flop 123 as a first input and the write-in pulse signal input produced by the set-reset flip-flop as the further input and in response thereto produce a differentiated contact pulse signal $SD_{130}$.

Figure 8:
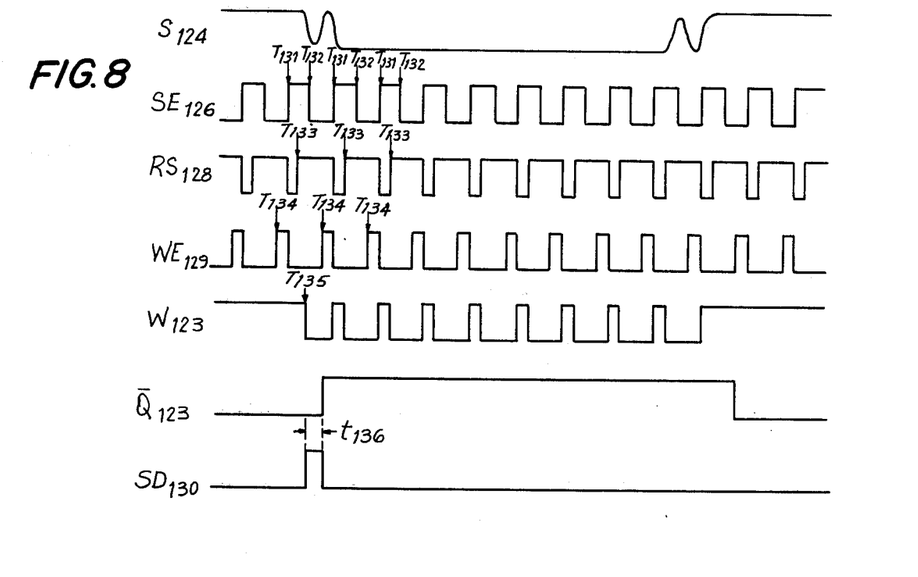
FIG. 8 is a wave diagram illustrating the operation of the electronic circuit depicted in FIG. 7.

The operation of the electronic circuit for eliminating chatter depicted in FIG. 7 is illustrated in FIG. 8. The contact signal $S_{124}$ is applied to the set input terminal of the set-reset flip-flop by the input timing circuit $SE_{125}$ at timing sequences between time $T_{131}$ and time $T_{132}$. However, between the time $T_{131}$ and the time $T_{133}$, the set-reset flip-flop is reset by the reset signal $RS_{128}$. Accordingly, the contact signal $S_{124}$ is effective to set the set the set-reset flip-flop only during the period from the time $T_{133}$ and $T_{132}$. Accordingly, if the possible period ($T_{131}$ to $T_{132}$) of the set input of the set-reset flip-flop overlaps the reset period ($T_{131}$ to $T_{133}$) as illustrated, the capacitive noise inherent in the wiring after the contact $S_{124}$ is closed is discharged by resistor $R_{127}$ during the reset period which improves the noise-resistance as discussed above in connection with FIG. 6. Accordingly, the leading edge of the write-in pulse $W_{123}$, which leading edge is coincident with the falling of contact signal $S_{124}$ during the period from $T_{133}$ to $T_{132}$ and the leading edge of output pulse $Q_{123}$ produced by D-flip-flop 123 determines the pulse width $t_{136}$ of the differentiated contact pulse $SD_{130}$. If the pulse signal $SD_{130}$ is the contact signal to be applied to a utilization device, a pulse width of ½ seconds and less will ordinarily not be detected (sensed) by a user and accordingly it is preferable to select an interval of time between the time $T_{133}$ and $T_{134}$ (maximum value for $t_{136}$) to be no more than ¼ of a second. Such a duration can also readily satisfy the above-noted condition by being sufficiently greater than any peak-to-peak period of the chatter signal. In an alternative embodiment, if the contact $S_{124}$ is coupled to a high potential $V^+$, and the set-reset flip-flop is formed with two NOR gates, the output gate 140 is an AND gate, and the bias resistor $R_{127}$ is referenced to the low potential $V^-$, the same output as the circuit illustrated in FIG. 7 is obtained.

Figure 9:
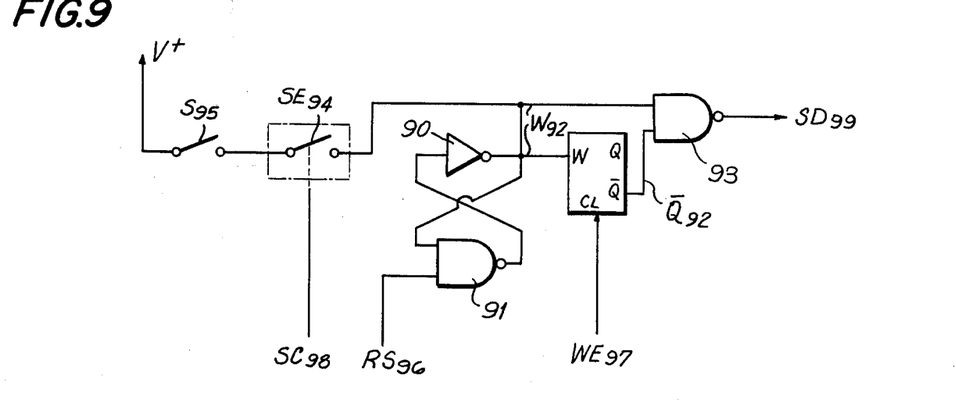
FIG. 9 is a circuit diagram of an electronic timepiece for eliminating chatter and producing a differentiated pulse constructed in accordance with an alternate embodiment of the instant invention.
Figure 10:
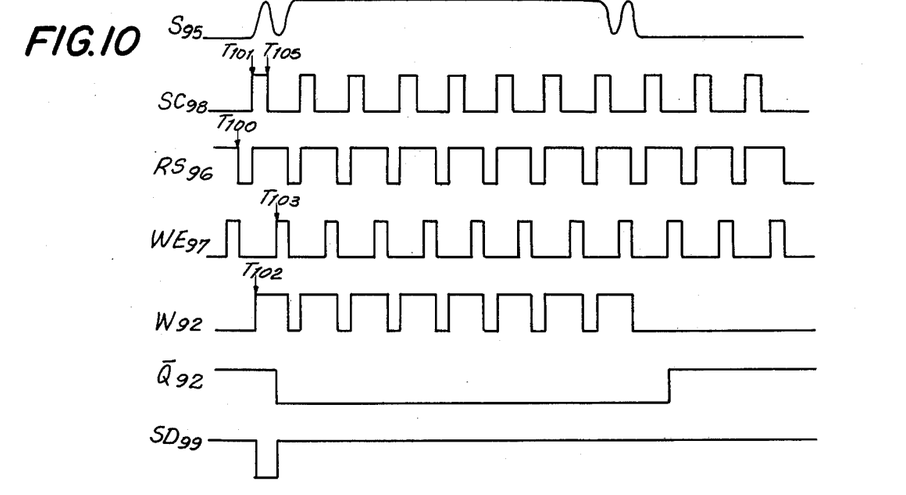
FIG. 10 is a wave diagram depicting the operation of the electronic circuit depicted in FIG. 9.

Referring now to FIG. 9, the same electronic circuit for eliminating chatter depicted in FIG. 11 is utilized with the differentiator pulse circuitry and input timing circuit detailed in the embodiment depicted in FIGS. 7 and 8. Thus, the set input is coupled to the output of inverter 90, thereby rendering unnecessary the input bias resistor. Similarly, the width of the output signal $SD_{99}$ is determined by the leading edge of the write-in pulse signal $W_{92}$ at time $T_{102}$ and the leading edge of the clock pulse signal $WE_{97}$ at time $T_{103}$. As is further noted in FIG. 10, the duration of the pulse width of the output signal $SD_{99}$ can be no greater than the time difference between the rising leading edge of the input timing signal $SC_{98}$ at time $T_{101}$ (selected to overlap the positive pulse of reset signal $RS_{96}$ to avoid undesired current flow and indeterminate output) and the rising leading edge of the clock pulse signal $WE_{97}$ at a time $T_{103}$. Moreover, the input timing of the contact signal $S_{95}$ can be made nearly coincident with the output timing signal $SD_{99}$.

It is noted, that the instant invention is characterized by electronic circuitry which completely eliminates the chatter signal from a contact signal and is particularly suitable for use in integrated semiconductor circuits. The electronic circuits of the instant invention are particularly defined by an asynchronous memory circuit such as a set-reset flip-flop capable of holding a binary state regardless of the changes in the input thereof until opposite binary state signals are applied thereto and an asynchronous memory circuit, such as a D-flip-flop for producing a change of state output in response to a change of state of the write-in pulse or for holding a state by the synchronous application of a clock pulse thereto. Moreover, the reset period of the asynchronous memory circuit and the write-in period of the synchronous memory circuit are synchronized so that same do not overlap each other. Thus, if the falling edge of the reset period (the rising edge of the settable period) precedes the rising edge of the write-in period of the synchronous memory by a predetermined interval of time, even if the signal applied to the said input of the non-synchronous memory ceases to be applied halfway during the predetermined interval of time, the non-synchronous memory holds such state until the write-in period of the synchronous memory circuit occurs. Moreover, the synchronous memory continues to hold the state of the asynchronous memory as same is reset and once again set prior to the occurrence of the write-in period of the synchronous memory. Accordingly, by properly synchronizing the operating frequency of the respective synchronous and asynchronous memory circuits, the high frequency chatter signal component is entirely eliminated from the low frequency output signal in accordance with the instant invention.

The instant invention is further characterized by each of the electronic circuits for removing chatter being entirely formed of component elements, with the exception of the switch, which are readily integrated into a circuit chip. Moreover, the number of component elements utilized to synthesize the electronic chatter eliminating circuits is sufficiently few as to avoid effecting a rise in the cost of such circuits when same are formed in large scale integrated circuits chips (LSI). Moreover, when the electronic circuits of the instant invention are utilized in instruments requiring the elimination of chatter from exterior mounted switches, the advantages are considerable in the light of the reduced cost, improved reliability and omission of circuit elements not integratable into the circuit chip.

Additionally, the power consumption of electronic circuits of the instant invention is significantly decreased by utilizing C-MOS elements to form same. One particular application of the instant invention is in electronic wristwatches, wherein the small size thereof requires relatively simple and miniaturized integrated circuitry which is also helpful in reducing power consumption in the wristwatch. The instant invention is also suitable for use in distinguishing multiplexed digital signals and the like.

Finally, it is noted that the instant invention is characterized by synchronizing the periodic pulse signals respectively applied to the asynchronous memory circuit and the synchronous memory circuit and if an input timing circuit is utilized, the periodic pulse applied thereto. It is noted that the circuitry for producing such synchronized signals is not illustrated in the drawings and same is not a part of the instant invention. If for example, the instant invention were utilized in an electronic wristwatch, the high frequency time standard could be utilized as a basic synchronization time base, and well known delay circuitry and wave shaping circuitry would provide the respective synchronization relationships detailed in the instant application.

Finally, it is noted that the term "leading edge" as utilized hereinabove refers to the transition of a pulse at the time that same changes state and hence is intended not to distinguish between rising and falling leading edges unless so modified.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. An electronic circuit for insuring the application of a contact signal comprising in combination contact means for producing a contact signal representative of a change of state; a first periodic pulse signal having a leading edge; asynchronous logic means for receiving as a first input said contact signal and as a second input said first periodic pulse signal, and in response to a coincidence in the changed state of said contact signal and said first periodic pulse signal producing at least one write-in pulse, said asynchronous logic gating means being a set-reset flip-flop means including an inverter means defining an output terminal and a NAND gate means defining a reset input terminal, said first periodic pulse signal being applied to said reset input terminal, and said contact signal being applied to said output terminal, said set-reset flip-flop means producing at least one write-in pulse in response to detecting a coincidence in the state of said first periodic reset pulse signal and said change of state contact signal; a second periodic pulse signal having a leading edge and being synchronized with respect to said first periodic pulse signal so that said leading edge of said first periodic pulse signal defining said coincidence condition precedes a leading edge of said second periodic pulse signal; and synchronous logic means for receiving as a first input said write-in pulses produced by said asynchronous logic means and as a second input said second periodic pulse signal, and in response to each said write-in pulse and the leading edge of said second periodic pulse signal, producing an output signal representative of the changed state of said contact signal.

2. An electronic circuit as claimed in claim 1, wherein said synchronous logic means is a delay flip-flop means, said delay flip-flop means including a write-in input for receiving said write-in pulses produced by said set-reset flip-flop means and a clock input for receiving said second periodic pulse signals and in response to the leading edge of said second periodic signal producing said output signal.

3. An electronic circuit as claimed in claim 1, and including input timing means disposed intermediate said contact means and said inverter means output terminal for synchronizing the application of said contact signal with the application of said first periodic pulse signal applied to said reset input terminal of said set-reset flip-flop means.

4. An electronic circuit as claimed in claim 3, wherein said input timing circuit includes transistor switching means including a switching terminal; and a third periodic pulse signal synchronized with respect to said first periodic pulse signal said third periodic pulse signal and being applied to said switching terminal to synchronize the application of said contact signal to said inverter means output terminal, the portion of said third periodic pulse signal effecting the application of said contact signal to said inverter means output terminal occurring substantially during the portion of said first periodic pulse signal defining said coincidence state detected by said set-reset flip-flop means.

5. An electronic circuit as claimed in claim 1, wherein said contact signal includes a high frequency chatter signal component, and said leading edge of said first periodic pulse signal is synchronized to precede said leading edge of said second periodic pulse signal by a predetermined interval of time at least equal to the period of the chatter signal component.

6. An electronic circuit for insuring the application of a contact signal comprising in combination contact means for producing a contact signal representative of a change of state; a first periodic pulse signal having a leading edge; asynchronous logic means for receiving as a first input said contact signal and as a second input said first periodic pulse signal, and in response to a coincidence in the changed state of said contact signal and said first periodic pulse signal producing at least one write-in pulse; a second periodic pulse signal having a leading edge and being synchronized with respect to said first periodic pulse signal so that said leading edge of said first periodic signal defining said coincidence detection precedes a leading edge of said second pulse signal; and synchronous logic means for receiving as a first input said write-in pulses produced by said asynchronous logic means and as a second input said second periodic pulse signal, and in response to each said write-in pulse and leading edge of said second periodic pulse signal, producing an output signal representative of the changed state of said contact signal, and including a third periodic pulse signal, input timing means disposed intermediate said switching means and said asynchronous logic means for periodically applying said contact signal as said first input to said asynchronous logic means, said third periodic pulse signal being synchronized with respect to said first and second periodic pulse signals so that the portion of said third periodic pulse signal applying said contact signal to said asynchronous logic means is coincident with a portion of said first periodic pulse signal during which a write-in pulse may be produced, and output logic means adapted to receive as a first input said write-in pulses and as a second input the output signal produced by the synchronous logic means, and in response thereto to produce an output signal having a pulse width defined by the leading edge of said write-in pulse and leading edge of said second periodic pulse signal.

* * * * *